United States Patent [19]
Lowenschuss

[11] 4,240,034
[45] Dec. 16, 1980

[54] DIGITAL FREQUENCY SYNTHESIZER
[75] Inventor: Oscar Lowenschuss, Goleta, Calif.
[73] Assignee: Raytheon Company, Lexington, Mass.
[21] Appl. No.: 941,818
[22] Filed: Sep. 11, 1978
[51] Int. Cl.³ .............................................. H03K 3/78
[52] U.S. Cl. ...................................... 328/14; 328/159
[58] Field of Search .......................... 328/14, 48, 159

[56] References Cited
U.S. PATENT DOCUMENTS

| | | | |
|---|---|---|---|
| 3,464,018 | 8/1969 | Cliff | 328/14 X |
| 3,882,404 | 5/1975 | Gerken | 328/14 |

Primary Examiner—John S. Heyman
Attorney, Agent, or Firm—Richard M. Sharkansky; Joseph D. Pannone

[57] ABSTRACT

A digital frequency synthesizer is disclosed wherein a series of binary level signals are produced, the level of such signals changing at a frequency related to a selected frequency f. The synthesizer includes a counter which counts clock pulses fed thereto at a pulse repetition frequency $f_{cp}$ producing a first digital word representative of the number counted clock pulses. An adder cumulatively adds a second digital word representative of $f_{cp}/nf$, where n is an even integer, each time the whole number portion of the cumulatively added second digital word equals the first digital word. A comparator produces a control signal indicative of whether the whole number portion of the cumulatively added second digital word is equal to the first digital word. A flip/flop, responsive to the control signal, produces a binary level signal, the level of such signal changing at a frequency related to the frequency f.

5 Claims, 13 Drawing Figures

FIG.2A LINE φ

FIG.2B LINE EN

FIG.2C ACCUM. 48

FIG.2D COUNTER Q 52

FIG.2E COMPARATOR 50

FIG.2F $Q_A$

FIG.2G $\overline{Q}_B$

FIG.2H $Q_B$

FIG.2I LINE ENSR

FIG.2J $\hat{Q}_A$

FIG.2K $\hat{Q}_B$

FIG.2L $\overline{\hat{Q}}_B$

DIGITAL FREQUENCY SYNTHESIZER

BACKGROUND OF THE INVENTION

This invention relates generally to digital frequency synthesizers and more particularly to digital frequency synthesizers adapted to produce radio frequency signals.

As is known in the art, one type of digital frequency synthesizer includes a plurality of highly stable oscillators coupled to a plurality of counters or frequency multipliers to produce subharmonic frequency signals. These signals are then selectively combined using heterodyning mixers and filters to produce a signal having the desired frequency. Such apparatus is relatively expensive and not generally suited to produce signals having relatively short time durations such as pulses used in radar and pulse communication systems.

SUMMARY OF THE INVENTION

In accordance with the present invention, a digital frequency synthesizer adapted to produce a series of binary level signals having a frequency related to a predetermined frequency, f, comprises: Means for counting clock pulses produced at a pulse repetition frequency, $f_{cp}$, and for producing a first digital word representative of the number of counted clock pulses; means for cumulatively adding a second digital word representative of $f_{cp}/nf$, where n is an even integer, each time the whole number portion of such cumulatively added second digital word equals the first digital word; means for producing a control signal indicative of whether the whole number portion of the cumulatively added second digital word is equal to or unequal to the first digital word; and means, responsive to the control signal, for producing a binary level signal, the level of such binary signal changing at a frequency related to the predetermined frequency f.

BRIEF DESCRIPTION OF THE DRAWINGS

The invention will be more fully understood from the following description taken together in conjunction with the accompanying drawings in which.

DESCRIPTION OF THE PREFERRED EMBODIMENT

Figure 1:
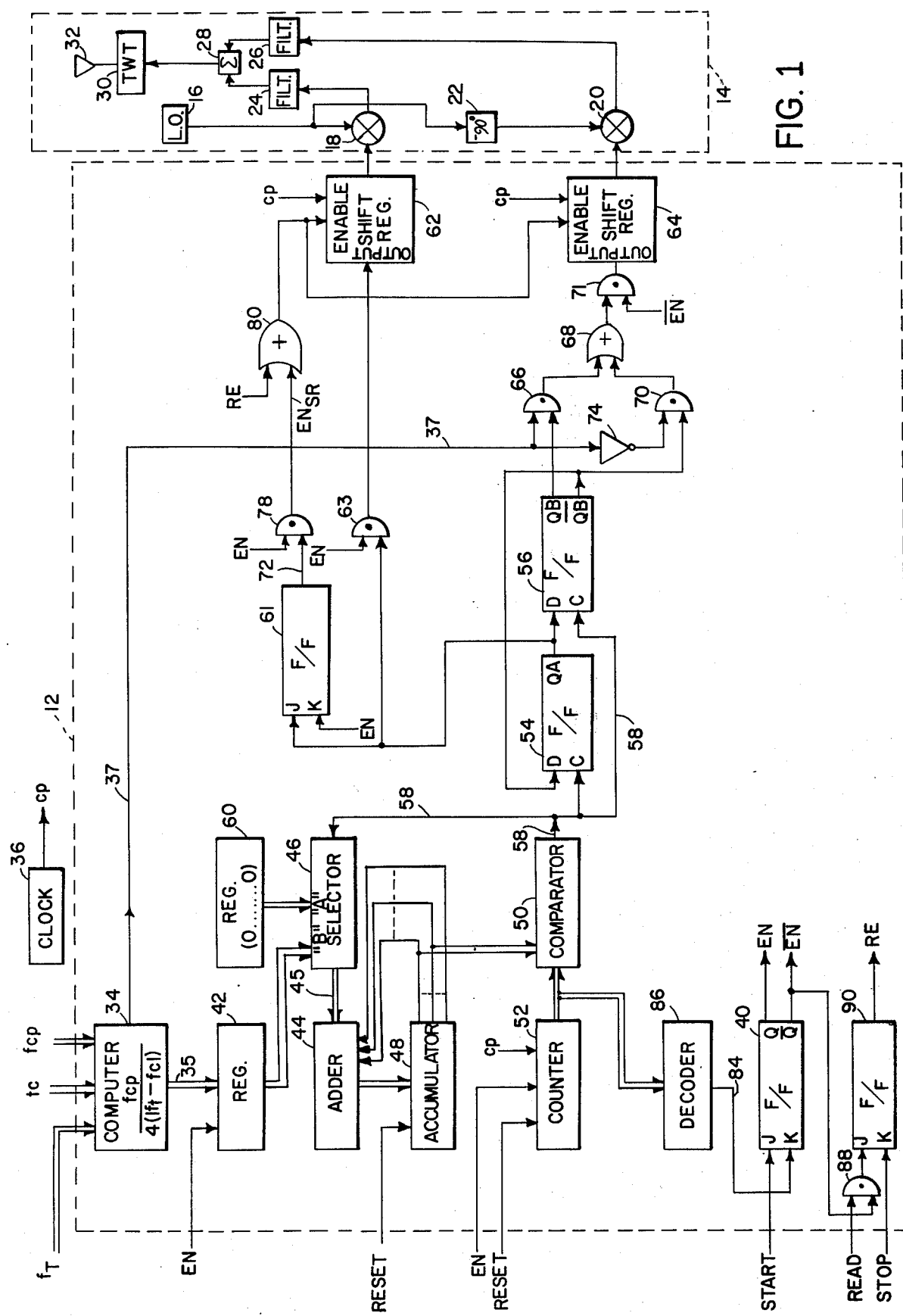
FIG. 1 is a block diagram of a frequency synthesizer according to the invention; and, FIGS. 2A–2L are timing diagrams useful in understanding the invention.

Referring now to FIG. 1, a digital frequency synthesizer 10 is shown to include an intermediate frequency synthesizer section 12 adapted to produce "in phase" and "quadrature" intermediate frequency signals and a radio frequency section 14 adapted to heterodyne the "in phase" and "quadrature" intermediate frequency signals to a radio frequency signal. The radio frequency section includes a conventional radio frequency oscillator 16 adapted to produce a radio frequency signal having a frequency $f_c$, here 9900 MHz, which is fed to a first mixer 18 as shown and to a second mixer 20 through a 90° phase shifter 22 as shown. The "in phase" intermediate frequency signal is also fed to the first mixer 18 as shown and the "quadrature" intermediate frequency signal is also fed to the second mixer 20, as shown. The outputs of first and second mixers 18, 20 are fed to bandpass filters 24, 26, respectively, as shown, here having bandpass frequencies of $f_c \pm f_s$, here 9900 MHz $\pm$ 150 MHz. That is, each one of the bandpass filters 24, 26 has a center frequency of $f_c = 9900$ MHz and a bandwidth of 2 $f_s = 300$ MHz. The signals passed by the filters 24, 26 are summed together in a conventional RF summing network 28. The output of such summing network 28 is fed to a conventional traveling wave tube amplifier (TWT) 30, and the amplified radio frequency signal is transmitted through a conventional antenna 32, as shown.

Referring now to the intermediate frequency synthesizer section 12, a digital computer 34 is provided to produce a digital word on bus 35 which represents the number of clock pulses produced by a conventional clock pulse generator 36 on line cp in a quarter cycle of the intermediate frequency signal to be produced by section 12 and to produce a binary control signal on line 37 indicative of whether the desired radio frequency signal to the transmitted has a frequency above or below the frequency $f_c$ of the local oscillator 16. It is first pointed out that the clock pulse generator 36 produces clock pulses on line cp at a frequency of $f_{cp}$, here 320 MHz. Therefore, if the desired frequency of the radio frequency signal to be transmitted is $f_T$, then the digital word produced by the computer on bus 35 is determined as follows:

$$\text{digital word on bus 35} = \frac{f_{cp}}{3(|f_T - f_c|)} \qquad (1)$$

where the frequencies $f_{cp}$, $f_T$ and $f_c$ are entered into the computer 34 by any convenient means, such as a conventional key board, not shown. Further, if the desired frequency $f_T$ is above (or equal to) the local oscillator frequency $f_c$, the signal on line 37 is high, representing a logical 1, and, if the desired frequency $f_T$ is lower than the local oscillator frequency $f_c$, then the signal on line 37 is low, representing a logical 0. By way of example, if it is desired to transmit a radio frequency signal of frequency $f_T = 9930$ MHz, the digital word on bus 35 (from Eq. 1) is $$\frac{320 \text{ MHz}}{4(30) \text{ MHz}} = 2.67 \text{ clock pulses per quarter cycle;}$$

the intermediate frequency signal has a frequency $f_{If} = f_T - f_c = 30$ MHz and the control signal on line 37 is high (logical 1), indicating the radio frequency signal has a frequency above the local oscillator frequency. It should be noted that the digital word on bus 35 has a whole number portion, here 2, and a decimal number portion, here 67.

In response to a start signal on line "START," J-K flip/flop 40 is placed in a set condition and output Q thereof goes high, producing a high signal on enable line EN. In response to such high signal on line EN, the digital word on bus 35 becomes stored in a register 42. The output of register 42 is fed to a conventional selecter 46, as shown. Fed to adder 44 is a digital word on bus 45 produced at the output of selector 46. The sum of the digital word stored in a conventional accumulator register 48 and the digital word on bus 45 becomes stored in the accumulator register 48, such register 48 having been initially reset to 0 . . . 0 by a signal on line RESET prior to the start signal. The entire digital word stored in the accumulator register 48 is fed to the adder 44 while just the whole number portion of the digital word stored in accumulator register 48 is fed to a comparator 50. That is, the upper bits of the digital word stored in accumulator register 48 which represent the whole number portion of such digital word are fed to the comparator 50. Also fed to comparator 50 is a conventional digital counter 52. Counter 52 is initially reset to 0 . . . 0 by a signal on line RESET prior to the start signal. When enabled by the signal on line EN, counter 52 counts the clock pulses fed thereto on line cp by clock pulse generator 36. The contents of the counters 52 therefore represents the number of clock pulses fed to such counter 52 after such counter 52 is enabled by the signal on line EN.

Comparator 50 compares the counted number of clock pulses counted by counter 52 with the whole number portion of the digital word stored in the accumulator register 48, and when such are equal, a "high" or logical 1 signal is produced by comparator 50, whereas if such are unequal or "low," a logical 0 is produced. That is, if:

$$\text{contents of counter 52} = \text{contents of accumulator 48,} \quad \text{comparator 50 output} = 1; \quad (a)$$

whereas if:

$$\text{contents of counter 52} \neq \text{contents of accumulator 48,} \quad \text{comparator 50 output} = 0. \quad (b)$$

The output of comparator 50 is fed to selector 46 and a pair of "D" type flip/flops 54, 56 via line 58, as shown. The signal on line 58 provides a control signal for selector 46 and, in particular, when the signal on line 58 is logical 0, the digital word fed to terminal "A" of such selector 46 is passed to adder 44 via bus 45, whereas if the signal on line 58 is logical 1, the digital word on terminating "B" becomes fed to adder 44 via bus 45. A conventional register 60 having 0 . . . 0 stored therein is here coupled to the terminal "A" of selector 48.

The signal on line 58 is also fed to the "clock" or c terminals of the D type flip/flops 54, 56, as shown. The "Q" output of flip/flop 54 (here labeled $Q_A$) is fed to the "D" terminal of the flip/flop 56, to the J terminal of J-K flip/flop 61, and to the input terminal of a shift register 62 through AND gate 63, as shown. Also connected to AND gate 63 is enable line EN, as shown. The $\overline{Q}$ terminal of flip/flop 56 (here labeled $\overline{Q_B}$) is fed to the D terminal of flip/flop 54, as shown. The "Q" output of flip/flop 56 (here labeled $Q_B$) is fed to the input terminal of shift register 64 through AND gate 66, OR gate 68 and AND gate 71, as shown, and output $Q_B$ is fed to the input of such shift register 64 through OR gate 68, AND gate 70 and AND gate 71, as shown. The control signal on line 37 is fed to AND gate 66 to enable the output $Q_B$ to be coupled to the "input" terminal of shift register 64 through OR gate 68 when AND gate 71 is enabled by the signal on line EN when the control signal on line 37 is "high" or logical 1, and such control signal is fed to AND gate 70 through inverter 74 to enable the output $Q_B$ to be coupled to the input terminal shift register 64 through OR gate 68 when the signal on line 37 is "low" or logical 1 when AND gate 71 is enabled by the enable signal on line EN.

As will be discussed hereinafter, flip/flops 54, 56 are initialized to produce "low" or logical 0 signal at outputs $Q_A$, $Q_B$. Further, the J-K flip/flop 61 is placed in a reset condition by the enable signal on line EN, thereby producing a "low" or logical 0 signal on line 72 in response to a "high" signal on line EN. When the signal at output $Q_A$ of flip/flop 54 first goes high (logical 1) for the first time after start, flip/flop 61 is placed in a set condition and the signal on line 72 goes "high." The signal on line 72 is fed to AND gate 78 as shown. Also fed to such AND gate 78 is the enable line EN, as shown. The output of AND gate 78 is fed through OR gate 80 to the "enable" terminals of shift registers 62, 64, as shown. When enabled, the signal on the input terminals of shift registers 62, 64 become stored in the shift registers in response to the clock pulses fed to such shift registers 62, 64 via line cp. As will be discussed hereinafter, after a predetermined number of clock pulses have been counted by counter 52, here a number equal to the number of stages in the shift registers 62, 64, a "high" signal is produced on line 84 by decoder 86. The signal on line 84 places the J-K flip/flop 40 on the reset state, producing a "low" or logical 0 signal on line EN and a high signal on line $\overline{EN}$ disabling further storage by the shift register 62, 64. After such shift registers 62, 64 have become full, a read signal is applied to line READ which passes through AND gate 88 to the J terminal of J-K flip/flop 90, producing a high signal on line RE. This enables the data stored in the shift registers 62, 64 to be read therefrom in response to clock pulses on line cp and hence at a rate $f_{cp}$. The data read from the shift registers 62, 64 is fed to the radio frequency section 14 for connection to the desired radio frequency signal. After the data has been read, a stop signal is applied to line RE to disable the shift registers 62, 64.

Referring now also to FIGS. 2A–2L, the operation of the intermediate frequency section 12 will be discussed. FIG. 2A shows the clock pulses on line cp at a frequency $f_{cp}$, here at a frequency $f_{cp}=320$ MHz. In response to a start signal on line START at time $t_{START}$, the signal on enable line EN goes "high" as shown in FIG. 2B, thereby enabling storage of the digital word on line 35 into register 42. Here, for example, the digital word is $(2.67)_{10}$ as discussed above. The digital word also becomes stored in the accumulator register 48 as shown in FIG. 2C. In response to the first clock pulse after the enable signal, the counter 52 produces a digital word $(1)_{10}$ as shown in FIG. 2D. Comparator 50, in response to the whole number portion of the digital word stored in the accumulator 48 (here $(2)_{10}$) and the digital word produced by counter 52 (here $(1)_{10}$) produces a logical 0 on line 58. Selector 46, in response to the logical 0 signal, couples the contents of register 60 (here 0) to line 45, and hence the accumulator 48 continues to store $(2.67)_{10}$. In response to the next clock pulse, counter 52 produces a digital word $(2)_{10}$. Comparator 50, in response to the whole number portion of the digital word stored in the accumulator 48, here $(2)_{10}$, and the digital word now stored in counter 52, here $(2)_{10}$, produces a logical 1 on line 58 as shown in FIG. 2E. In response to such logical 1 signal the contents of accumulator 48 (here $(2.67)_{10}$) passes to adder 44 and becomes added to the digital word stored in register 42 (here $(2.67)_{10}$), the sum (here $(5.33)_{10}$) becoming stored in accumulator register 48 as shown in FIG. 2C, thereby returning the output of comparator 50 on line 58 to a logical 0 as shown in FIG. 2E. The output of such comparator remains at logical 0 until counter 52 produces a digital word representative of $(5)_{10}$. Then the comparator 50 output, i.e., line 58, goes "high" (as shown in FIG. 2E), the contents of accumulator 48 (now $(5.33)_{10}$) become added to the contents in register 42 (i.e., $(2.67)_{10}$) to produce $(8.0)_{10}$ which becomes stored in the accumulator 48, returning the output of comparator 50 (i.e., line 58) to a logical 0 as shown in FIGS. 2C, 2D and 2E. It follows, then, that the digital word stored in register 42 (i.e., here $(2.67)_{hd\ 10}$) becomes cumulatively added and stored in accumulator 48 each time the whole number portion of the digital word stored in accumulator 48 becomes equal to the digital word stored in counter 52. Further, the output of comparator 50 (i.e., line 58) changes from a logical 0 to a logical 1 each time the digital word stored in counter 52 is equal to the whole number portion of the digital word stored in accumulator 48, producing a series of pulses on line 58 as shown in FIG. 2E. These pulses on line 58 are fed to the "c" or "clock" terminal of D-type flip/flops 54, 56, as shown. As discussed above, such flip/flops are initialized to produce logical 0's at outputs $Q_A$, $Q_B$. Hence, the outputs $Q_A$, $Q_B$, $\overline{Q}_B$ produce the following logical signals in response to the pulses on line 58:

| Pulse on line 58 (See FIG. 2E) | $Q_A$ | $\overline{Q}_B$ | $Q_B$ |
|---|---|---|---|
| A | 1 | 1 | 0 |
| B | 1 | 0 | 1 |
| C | 0 | 0 | 1 |
| D | 0 | 1 | 0 |
| E | 1 | 1 | 0 |
| F | 1 | 0 | 1 |
| G | 0 | 0 | 1 |
| H | 0 | 1 | 0 |
| I | 1 | 1 | 0 |
| J | 1 | 0 | 1 |
| K | 0 | 0 | 1 |
| . | . | . | . |
| . | . | . | . |
| . | . | . | . |

The outputs $Q_A$, $\overline{Q}_B$ and $Q_B$ are shown in FIGS. 2F, 2G and 2H, respectively.

Considering first the signal produced at output $Q_A$ (FIG. 2F), when such output first goes to a logical 1 (in response to pulse A), the output of flip/flop 61 (FIG. 1) goes high (logical 1) and hence a logical 1 is produced at the output of AND gate 78 on line $EN_{SR}$ as shown in FIG. 2I. Hence, the data at output $Q_A$ passes through enabled AND gate 63 and becomes stored in shift register 62 in response to the clock pulses on line cp as shown in FIG. 2J as a series of logical 1's and 0's, until such shift register 62 is full, at which time flip/flop 40 becomes reset by the signal on line 84 because then a low signal is produced on line EN. Considering now the outputs of flip/flop 56, either the signal at output $Q_B$ or the signal at output $\overline{Q}_B$ will become stored in shift register 64 depending on the logical signal on line 37. Here in the example being considered, the desired radio frequency signal has a frequency above the frequency of the local oscillator 16 and, hence, as discussed above, the signal on line 37 is "high" or logical 1. Hence, the signal at output $Q_B$ becomes sequentially stored as a series of logical 1's and logical 0's in shift register 64 in response to clock pulses on line cp as shown in FIG. 2K.

After the shift registers 62, 64 have become full, a read signal is applied to line READ, producing a logical 1 or high signal in line RE. The bits stored in shift registers 62, 64 become sequentially read therefrom in response to clock signals on line cp. The outputs of shift registers 62, 64 are fed to mixers 18, 20, respectively.

Such outputs appear as binary signal having "high" and "low" levels as indicated by the dotted lines in FIGS. 2J and 2K, respectively. It should be noted that, to a 1-bit quantization, the signal at the output of shift register 62 (FIG. 2J) may be represented as $\sin 2\pi f_{IF}t$ and, likewise, the output of shift register 64 may be represented as $-\cos 2\pi f_{IF}t$, where $f_{IF}$ is the intermediate frequency, here 30 MHz. Further, the signal produced by the local oscillator 16 may be represented as $\sin 2\pi f_c t$. Hence the signal produced at the output of summing network 28 may be represented as $-\cos 2\pi(f_c+f_{IF})t$, that is, a signal having a frequency, $f_T = f_c + f_{IF}$, here 9930 MHz. If, on the other hand, the desired radio frequency signal to be transmitted was to have a frequency 9870 MHz, the control signal on line 37 would have been "low" and the output $\overline{Q}_B$ shown in FIG. 2G would have been stored in the shift register 64 (instead of output $Q_B$). Hence, the data stored in the shift register 64 would be a series of logical 1's and logical 0's as shown in FIG. 2I. The envelope, shown by the dotted line, may be considered as representing $\cos 2\pi f_{IF}t$. Hence, the output of summing network 28 may be represented in such case as $\cos 2\pi(f_c - f_{IF})t$, that is, a signal having a frequency $f_T = f_c + f_{IF}$, here 9870 MHz.

Having described a preferred embodiment of this invention, it is evident that other embodiments incorporating these concepts may be used. It is felt, therefore, that this invention should not be restricted to the disclosed embodiment, but rather should be restricted only by the spirit and scope of the appended claims.

What is claimed is:

1. A digital frequency synthesizer adapted to produce a signal having a frequency f, comprising:
   (a) counter means, responsive to clock pulse signals having a pulse repetition frequency $f_{cp}$, for producing a first digital word representative of the number of counted clock pulses;
   (b) adding means for cumulatively numerically adding a second digital word representative of $f_{cp}/nf$ (where n is an even integer) each time a control signal indicates that the whole number portion of the cumulatively numerically added second digital word equals the first digital word;
   (c) comparator means fed by the first digital word and the whole number portion of the cumulatively numerically added second digital word for producing the control signal, such control signal being indicative of whether the whole number portion of the cumulatively numerically added second digital word is equal to or unequal to the first digital word; and
   (d) output means responsive to the control signal for producing a signal having a frequency related to the frequency f.

2. The digital frequency synthesizer recited in claim 1 wherein the output means includes means for producing a binary signal level in response to each clock pulse, the binary state of such binary signal level changing at a frequency related to the frequency f.

3. A digital frequency synthesizer, comprising:
   (a) counter means for counting a series of clock pulses having a frequency $f_{cp}$ and for producing a first digital word representative of the number of counted pulses;
   (b) means for producing a second digital word representative of $f_{cp}/nf$, where f is a predetermined frequency and n is an even integer;

(c) an accumulator;

(d) an adder having an output coupled to the accumulator;

(e) comparator means fed by the counter means and responsive to the whole number portion of a third digital word stored in the accumulator for producing a control signal indicative of whether the whole number portion of the third digital word is equal to or unequal to the first digital word produced by the counter means;

(f) means, responsive to the control signal, for enabling the third digital word stored in the accumulator and the second digital word to pass to the adder and become cumulatively numerically added each time the control signal indicates that the whole number portion of the third digital word is equal to the first digital word and for inhibiting such stored third digital word and the second digital word from becoming cumulatively numerically added in the adder when the control signal indicates that the whole number portion of the third digital word is not equal to the first digital word; and (g) output means, responsive to the control signal, for producing a signal having a frequency related to the frequency f.

4. The digital frequency synthesizer recited in claim 3 wherein the output means includes a flip/flop fed by the control signal, the state of such flip/flop changing in accordance with the control signal.

5. A digital frequency synthesizer adapted to produce a signal having a frequency f comprising:

(a) counter means responsive to clock pulse signals having a pulse repetition frequency $f_{cp}$, for producing a first digital word representative of the number of counted pulses;

(b) adding means, responsive to a control signal, for cumulatively numerically adding a second digital word representative of $f_{cp}/nf$, where n is an integer, when the control signal indicates that the whole number portion of the cumulatively numerically added second digital word equals the first digital word;

(c) comparator means, responsive to the whole number portion of the cumulatively numerically added second digital word and the first digital word produced by the counter means, for producing the control signal, such control signal being indicative of whether the whole number portion of the cumulatively added second digital word is equal to or unequal to the first digital word; and (d) output means responsive to the control signal for producing a signal having a frequency related to the frequency f.

* * * * *

UNITED STATES PATENT OFFICE
CERTIFICATE OF CORRECTION

Patent No. 4,240,034              Dated December 16, 1980

Inventor(s) Oscar Lowenschuss

It is certified that error appears in the above-identified patent and that said Letters Patent are hereby corrected as shown below:

Column 1, line 58, after --section insert --14--;

Column 2, line 18, delete --the-- and replace with --be--.

Column 2, line 59, delete --selecter-- and replace with --selector--;

Column 3, line 9, delete --counters-- and replace with --counter--;

Column 4, line 16, delete --on-- and replace with --in--;

Column 5, line 5, delete --(2.67 hd 10)-- and replace with --$(2.67)_{10}$)--;

Column 6, line 1, delete --signal-- and replace with --signals--.

Signed and Sealed this

Sixteenth Day of June 1981

[SEAL]

*Attest:*

RENE D. TEGTMEYER

*Attesting Officer*       *Acting Commissioner of Patents and Trademarks*